(12) United States Patent
Ye et al.

(10) Patent No.: US 7,558,419 B1
(45) Date of Patent: Jul. 7, 2009

(54) SYSTEM AND METHOD FOR DETECTING INTEGRATED CIRCUIT PATTERN DEFECTS

(75) Inventors: Jun Ye, Palo Alto, CA (US); Yu Cao, Cupertino, CA (US); R. Fabian Pease, Stanford, CA (US)

(73) Assignee: Brion Technologies, Inc., Santa Clara, CA (US)

( * ) Notice: Subject to any disclaimer, the term of this patent is extended or adjusted under 35 U.S.C. 154(b) by 918 days.

(21) Appl. No.: 10/917,060

(22) Filed: Aug. 12, 2004

Related U.S. Application Data (60) Provisional application No. 60/495,240, filed on Aug. 14, 2003.

(51) Int. Cl.
*G06K 9/00* (2006.01)
(52) U.S. Cl. ........................ 382/144; 382/232; 382/264
(58) Field of Classification Search ......... 382/141–152, 382/209
See application file for complete search history.

(56) References Cited

U.S. PATENT DOCUMENTS

| | | | |
|---|---|---|---|
| 4,579,455 A * | 4/1986 | Levy et al. .................. 356/394 |
| 4,669,123 A * | 5/1987 | Kobayashi et al. .......... 382/144 |
| 4,805,123 A * | 2/1989 | Specht et al. ............... 382/144 |
| 4,845,558 A * | 7/1989 | Tsai et al. ................... 348/126 |

(Continued)

OTHER PUBLICATIONS

"Photomask Production Integration of KLA STARlight™ 3000 System", Kalk et al, Proc. Of SPIE, vol. 2621, 15$^{th}$ Annual BACUS Symposium on Photomask Technology and Management, Dec. 1995, pp. 112-121.

(Continued)

*Primary Examiner*—Matthew C. Bella
*Assistant Examiner*—Sath V. Perungavoor
(74) *Attorney, Agent, or Firm*—Pillsbury Winthrop Shaw Pittman LLP (57) ABSTRACT

There are many inventions described and illustrated herein. In one aspect, the present invention is directed to a technique of, and system for inspecting integrated circuits, including, for example, patterns projected, provided or formed on a wafer using photomasks, or patterns on the photomask itself. The inspection system and technique of this aspect includes first identifying, determining and/or detecting areas and/or patterns that are potentially defective by removing, filtering and/or eliminating from a set of potential defects any and/or all typical, regular or normal patterns. The identification, determination and/or detection of potential defects may be performed relatively quickly by a rapidly executing algorithm. In this way, a first or "coarse" analysis is performed rapidly and some, many, all or substantially all of the regular, normal or typical patterns are eliminated from further analysis. Thereafter, a second more detailed analysis is performed. This second analysis focuses on the set of potential defects that were identified, determined and/or detected during the first analysis of the photomask or wafer (i.e., the "coarse" analysis). The second analysis may be considerably a more detailed or a "fine" analysis relative to the first or "coarse" analysis. Indeed, in one embodiment, the second analysis may implement a more computational intensive process, without sacrificing throughput, since only a small portion of the photomask or wafer is inspected in the second analysis. In this way, the detailed analysis of the defect candidates may identify (i) all or substantially all of the actual defects and/or (ii) only the actual defects from the potential defects identified during the first analysis.

35 Claims, 5 Drawing Sheets

U.S. PATENT DOCUMENTS

| | | | |
|---|---|---|---|
| 4,926,489 A * | 5/1990 | Danielson et al. | 382/144 |
| 4,969,198 A * | 11/1990 | Batchelder et al. | 382/147 |
| 5,125,040 A * | 6/1992 | Matsui et al. | 382/144 |
| 5,129,009 A * | 7/1992 | Lebeau | 382/149 |
| 5,182,718 A | 1/1993 | Harafuji et al. | |
| 5,237,621 A * | 8/1993 | Cox et al. | 382/143 |
| 5,308,991 A | 5/1994 | Kaplan | |
| 5,404,410 A * | 4/1995 | Tojo et al. | 382/144 |
| 5,537,670 A * | 7/1996 | Cox et al. | 382/219 |
| 5,563,702 A | 10/1996 | Emery et al. | |
| 5,640,237 A * | 6/1997 | Esrig et al. | 356/237.2 |
| 5,663,893 A | 9/1997 | Wampler et al. | |
| 5,723,233 A | 3/1998 | Garza et al. | |
| 5,737,072 A | 4/1998 | Emery et al. | |
| 5,774,222 A | 6/1998 | Maeda et al. | |
| 5,849,440 A * | 12/1998 | Lucas et al. | 382/144 |
| 5,888,675 A | 3/1999 | Moore et al. | |
| 6,077,310 A | 6/2000 | Yamamoto et al. | |
| 6,078,738 A | 6/2000 | Garza et al. | |
| 6,081,659 A | 6/2000 | Garza et al. | |
| 6,090,555 A | 7/2000 | Fiekowsky et al. | |
| 6,120,952 A | 9/2000 | Pierrat et al. | |
| 6,223,139 B1 | 4/2001 | Wang et al. | |
| 6,226,781 B1 | 5/2001 | Nistler et al. | |
| 6,243,855 B1 | 6/2001 | Kobayashi et al. | |
| 6,272,236 B1 | 8/2001 | Pierrat et al. | |
| 6,285,783 B1 * | 9/2001 | Isomura et al. | 382/147 |
| 6,370,679 B1 | 4/2002 | Chang et al. | |
| 6,397,165 B1 | 5/2002 | Fiekowsky | |
| 6,405,153 B1 | 6/2002 | Fiekowsky | |
| 6,449,749 B1 | 9/2002 | Stine | |
| 6,453,452 B1 | 9/2002 | Chang et al. | |
| 6,453,457 B1 | 9/2002 | Pierrat et al. | |
| 6,470,489 B1 | 10/2002 | Chang et al. | |
| 6,519,501 B2 | 2/2003 | Pierrat et al. | |
| 6,539,331 B1 | 3/2003 | Fiekowsky | |
| 6,611,767 B1 | 8/2003 | Fiekowsky et al. | |
| 6,757,645 B2 | 6/2004 | Chang et al. | |
| 6,760,473 B1 | 7/2004 | Fiekowsky | |
| 6,765,651 B1 | 7/2004 | Fiekowsky et al. | |
| 7,003,758 B2 * | 2/2006 | Ye et al. | 716/21 |
| 7,242,801 B1 * | 7/2007 | Wallack et al. | 382/173 |
| 7,333,650 B2 * | 2/2008 | Yamamoto et al. | 382/145 |
| 2003/0048939 A1 * | 3/2003 | Lehman | 382/144 |
| 2003/0147676 A1 * | 8/2003 | Sakata et al. | 399/286 |
| 2004/0096883 A1 | 5/2004 | Fiekowsky et al. | |
| 2004/0225488 A1 | 11/2004 | Wang et al. | |
| 2005/0002560 A1 * | 1/2005 | Yamamoto et al. | 382/156 |
| 2007/0091187 A1 * | 4/2007 | Lin | 348/246 |
| 2008/0075354 A1 * | 3/2008 | Kalevo | 382/149 |

OTHER PUBLICATIONS

"Defect Detection and Classification in VLSI Pattern Inspection", Soo-Ik Chae, Sep. 1987, Ph.D. Dissertation.

"Improved Method for Measuring and Assesssing Reticle Pinhole Defects for the 100nm Lithography Node", Taylor et al., Photomask Japan 2002, Apr. 2002.

"Mask Defect Disposition: Flux-Area Measurement of Edge, Contact, and OPC Defects Correlates to Wafer and Enables Effective Decisions", Fiekowsky et al., Photomask Japan 2001, Paper 4409-10, Apr. 2001.

"Contact Holes: Optical Area Measurement Predicts Printability and is Highly Repeatable", By Glen Scheid, LSI Logic Corp.; Taylor et al., Photomask Japan 2001, Paper 4409-11, Apr. 2001.

"New Optical Metrology for Masks: Range and Accuracy Rivals SEM", Cottle et al., Photomask Japan 2001, Poster 4409-60, Apr. 2001.

"Soft Defect Printability: Correlation to Optical Flux-Area Measurements", Taylor et al., the SPIE $20^{th}$ Annual BACUS Symposium on Photomask Technology and Management, Conference 4186, Sep. 2000.

"The End of Thresholds: Subwavelength Optical Linewidth Measurement Using the Flux-Area Technique", Fiekowsky, Photomask Japan 2000, Poster 4066-67, Apr. 2000.

"Defect Printability Measurement in the KLA-351: Correlation to Defect Sizing Using the AVI Metrology System", Fiekowsky et al., the SPIE $19^{th}$ Annual BACUS Symposium on Photomask Technology and Management, Conference 3873, Sep. 1999.

"Accurate and Repeatable Mask Defect Measurements for Quarter-Micron Technology", Fiekowsky, the SPIE $17^{th}$ Annual BACUS Symposium on Photomask Technology and Management, Sep. 1997.

"The AVI Photomask Metrology System", Automated Visual Inspection Presentation, Feb. 2002, 25 pages.

"Compact Formulation of Mask Error Factor for Critical Dimension Control in Optical Lithography", Zhang, et al., Microlithography, SPIE 2002, 4 pages.

"A Simulation Framework for Lithography Process Monitoring and Control Using Scatterometry", Bao et al., AEC/APC 2001, 4 pages.

"A Novel Approach for Modeling and Diagnostics of Lithography Process", Wang et al., AEC/APC 2001, 5 pages.

"Optimum sampling for characterization of systematic variation in photolithography", Cain et al., Microlithography, SPIE 2002, 13 pages.

"Electrical linewidth metrology for systematic CD variation characterization and causal analysis", Cain et al., Microlithography, SPIE 2003, 12 pages.

* cited by examiner

FIGURE 10　　　　　　　FIGURE 11

SYSTEM AND METHOD FOR DETECTING INTEGRATED CIRCUIT PATTERN DEFECTS

CROSS-REFERENCE TO RELATED APPLICATIONS

This application claims priority to U.S. Provisional Application Ser. No. 60/495,240, entitled "System and Method for Detecting IC Pattern Defects", filed Aug. 14, 2003, the contents of which are incorporated by reference herein in their entirety.

This invention was made with Government support under contract N660001-02-1-8913 awarded by the Defense Advanced Research Projects Agency, The Government has certain rights in this Invention.

BACKGROUND

Briefly, in the semiconductor industry, microlithography (hereinafter "lithography") is the process of printing the integrated circuit ("IC") patterns on a wafer (for example, a semiconductor wafer such as silicon or GaAs). Currently, optically based lithography is the predominant technology used in volume IC manufacturing. Such lithography employs light in the visible to deep ultraviolet spectrum range to expose the resist on wafer. Following exposure the resist is developed to yield a relief image.

In optical lithography, a photomask (often called mask or reticle) is first written using electron-beam or laser-beam direct-write tools. The mask contains certain patterns and features that are used to create desired circuit patterns on a wafer. The process of fabricating a complete integrated circuit typically requires the use of many masks.

A typical photomask for optical lithography consists of a glass (or quartz) plate of 6-8 inches on a side, with one surface coated with a thin metal layer (for example, chrome) of a thickness of about 100 nm. The pattern, which is representative of a portion of the integrate circuit, is etched into the metal layer, thereby allowing light to transmit or pass through. The area where the metal is not etched or removed blocks or inhibits light transmission. In this way, a pattern may be projected onto the wafer.

Figure 1:
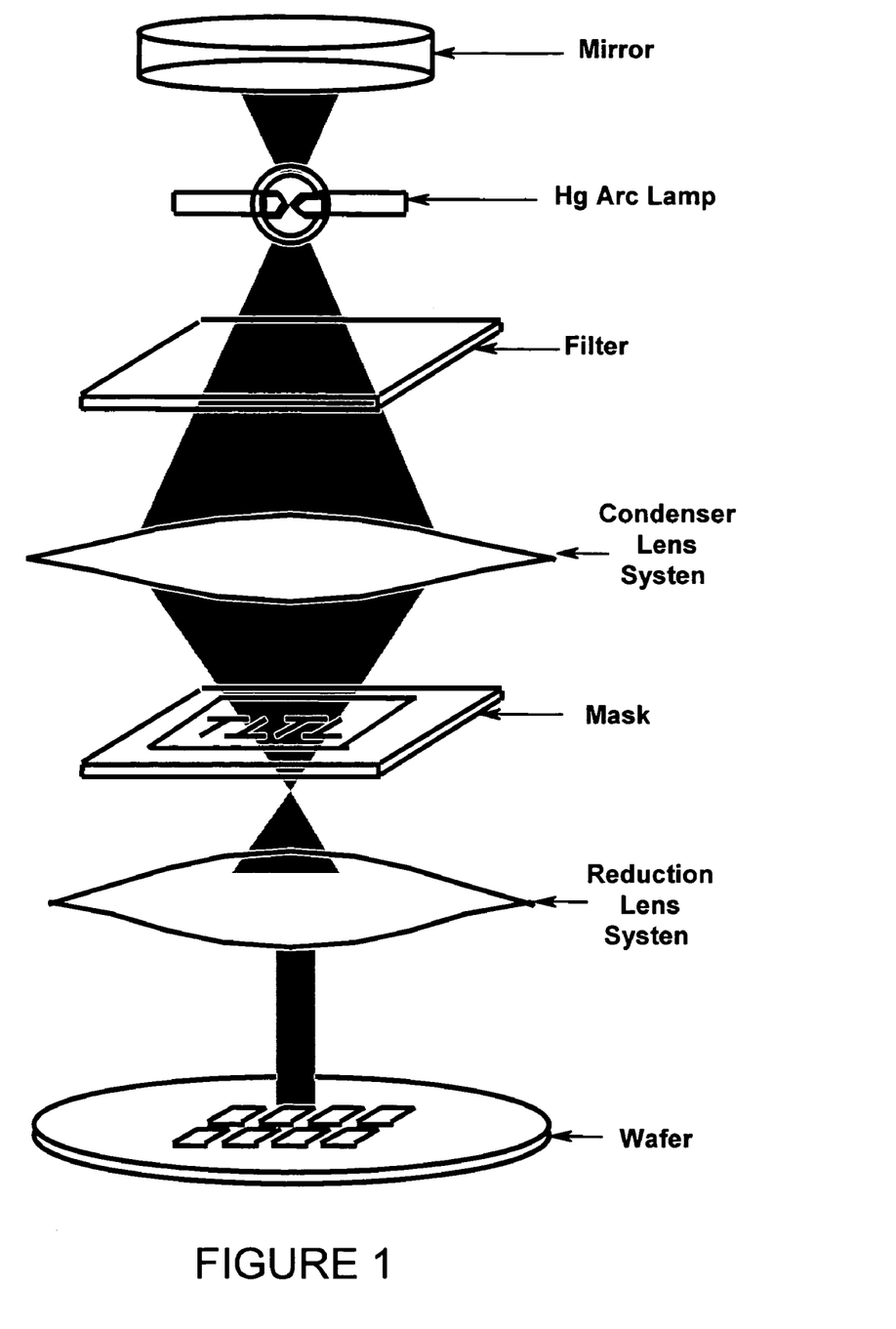
FIG. 1 is a simplified schematic representation of a reduction step-and-repeat optical lithography system (for example, stepper) with refractive optics.

The tool currently used in projecting the mask image onto wafer is called a stepper or scanner (hereinafter collectively called "photolithographic equipment" or "stepper"). (See, FIG. 1). The photomask contains the circuit pattern to be imaged on the wafer by the reduction lens system.

At various stages or steps of IC manufacturing, the masks and wafers must be inspected in order to identify or detect defects that impact the integrity of the fabrication process. For example, the photomask defect inspection is used to ensure that masks are defect free. This is a critical inspection since any undetected mistake or defect has the potential of creating many worthless IC wafers. As such, mask inspection typically requires 100% defect capture or detection rate.

In contrast, wafer inspection does not require 100% defect capture or detection rate, since wafer inspection is used for process control such as process debugging, tuning, failure analysis, and fabrication statistical process control.

Conventional techniques for mask defect inspection include:

Die-to-database ("D:DB"), which compares a captured optical image (or images captured using other means (for example, an electron beam system). From this point on, the "optical image" may be used to generally refer to the image captured by the inspection system, which may use optical imaging method, or other method like electron beam) of the photomask with a rendered image from the intended design pattern database.

Die-to-die ("D:D"), which compares two optical images from different dice on the same mask, where the two dice are designed to have the same pattern. Since the probability that the same defect happens at the same spot of two dice is almost zero, an "agreement" between the two images is considered to indicate good pattern, and a difference is considered to reflect a defect.

Conventional wafer inspection, however, nearly exclusively employs a D:D approach, because:

There is typically multiple dice on a wafer, so D:D is generally easy to implement.

Rendering multiple layers of database is extremely complex—generally, integrated circuits are comprised of multiple layers.

Wafer inspection is not intended to capture repeating defects (caused by defects on mask) between dice. Instead, wafer inspection is intended to identify random, generally non-repeating defects that occur during manufacturing.

There are several challenges of employing D:DB inspection of photomasks. First, a D:DB inspection system and technique tends to require extremely large computation capabilities in preparation, rendering and processing the database images. Indeed, as integrated circuit dimensions shrink, and optical proximity correction ("OPC") photomasks and phase shift photomasks ("PSM") are employed, the number of patterns in a unit area increases tremendously. Currently, for example, the pattern density is in the millions of patterns per $mm^2$. As such, the computational requirements to render the database image tend to explode as integrated circuit dimensions shrink and new technologies (for example, OPC photomasks and PSM) are implemented.

Moreover, the reduced pattern dimension introduces non-linearity effects in mask pattern generation and in image capturing. This requires even more computation overhead to process the database image before it can be compared with the captured optical image.

Second, to match the captured optical image with the database image tend to require the inspection system to have very high-precision alignment between the mask position and the database. This stringent precision may be compounded because of the desire for high throughput. In addition, there are also stringent requirements on the image acquisition system (for example, focus, vibration and/or distortion). These requirements, in the aggregate, cause the system hardware to be complex and expensive, and the setup and management thereof quite difficult.

For D:D inspection, some of the difficulties encountered in D:DB inspection are partially alleviated since there is no database image to be prepared and processed. However, D:D mask inspection techniques must still be concerned with matching the two captured images. This, as mentioned above, requires the inspection system to have very high-precision alignment between the two positions. In addition, the image acquisition system must be tightly controlled with respect to, for example, stage control, focus, stability and vibration.

Notably, one distinct disadvantage of D:D inspection is that it requires two or more dice to be present on the same mask. Large-die IC's tend to be manufactured with photomasks having only one die. Thus, D:D inspection may not be available for such large-die IC's (for example, advanced microprocessors and field programmable gate arrays ("FPGA")).

Thus, there is a need for a new system and technique for defect inspection of, for example, photomasks and the lithographic processes. There is a need for a defect self-inspection system and technique (i.e., defect detection based on a captured optical image itself without comparing to a reference image, where the reference image is the database image or an optical image from another die).

SUMMARY OF THE INVENTION

There are many inventions, and aspects of the inventions, described and illustrated herein. In a first principal aspect, the present invention is a method for inspecting a photomask used to generate integrated circuit patterns on a wafer. The method comprises generating a potentially defective circuit pattern set, having a plurality of potentially defective circuit patterns including a first circuit pattern that is defective and a second circuit pattern that is valid. Here, generating the potentially defective circuit pattern set includes comparing data which is representative of images of a plurality of circuit patterns to data which is representative of images of valid circuit patterns to identify at least one potentially defective circuit pattern. The method of this aspect further includes determining a defective circuit pattern in the potentially defective pattern set using a codebook including codes which are representative of valid circuit patterns and/or codes which are representative of invalid circuit patterns.

In one embodiment, the method of this aspect of the present invention may also include generating an image of at least a portion of the photomask, which includes an image of the plurality of circuit patterns. In one embodiment, generating an image of at least a portion of the photomask may include measuring intensity data, in situ, using an image sensor having a plurality of sensor cells. In another embodiment, generating an image of at least a portion of the photomask includes simulating the image using information in a mask database. Notably, simulating the image using information in a mask database may include converting a plurality of polygons, including resolution enhancement technology, to a pixel-based bitmap representation thereof.

In another embodiment, the data which is representative of the images of a plurality of circuit patterns are pixel-based bitmap representation thereof. In this embodiment, comparing a plurality of circuit patterns to valid patterns to identify the at least one circuit pattern that is potentially defective includes using a lossy compression algorithm to generate a lossy compressed image of the image and comparing the image to the lossy compressed image.

Notably, comparing a plurality of circuit patterns to valid patterns to identify the at least one circuit pattern that is potentially defective may include subtracting the data which is representative of the lossy compressed images and the data which is representative of images of valid circuit patterns. Here, the method may further include determining if the difference between the data which is representative of the lossy compressed images and the data which is representative of images of valid circuit patterns exceeds a predetermined threshold.

In yet another embodiment, determining a defective circuit pattern in the potentially defective pattern set includes using a knowledge base having images or information which are representative of valid circuit patterns. Moreover, determining a defective circuit pattern in the potentially defective pattern set may further include comparing the plurality of potentially defective circuits of the potential defect pattern set to a knowledge base having valid circuit pattern images or information which are representative of valid circuit patterns. The knowledge base may be continuously, periodically or intermittently updated with images or information which are representative of valid circuit patterns.

Further, determining a defective circuit pattern in the potentially defective pattern set further may include comparing the plurality of potentially defective circuits of the potential defect pattern set to a knowledge base having invalid circuit pattern images or information which are representative of invalid circuit patterns. The knowledge base may be continuously, periodically or intermittently updated with images or information which are representative of invalid circuit patterns.

The method may include selecting the codebook from a plurality of codebooks. The codebook may be selected on the basis of a type of circuit defect. The codebook may include an edge-shape code-space or an N×M image patch or region code-space.

In another principal aspect, the present invention is an inspection system for inspecting a photomask used to generate integrated circuit patterns on a wafer. The system comprises a user interface unit, a data storage unit and a data processing unit, coupled to the user interface unit and the data storage unit, to identify a defective circuit pattern in an integrated circuit pattern. The data processing unit generates a potentially defective circuit pattern set, having a plurality of potentially defective circuit patterns including a first circuit pattern that is defective and a second circuit pattern that is valid. The data processing unit generates the potentially defective circuit pattern set by comparing data which is representative of images of a plurality of circuit patterns to data which is representative of images of valid circuit patterns to identify at least one potentially defective circuit pattern. Further, the data processing determines a defective circuit pattern in the potentially defective pattern set using a codebook including codes which are representative of valid circuit patterns and/or codes which are representative of invalid circuit patterns.

In one embodiment, the data processing unit compares a plurality of circuit patterns to valid patterns using a lossy compression algorithm to generate a lossy compressed image of the image. In this embodiment, the data processing unit compares the image to the lossy compressed image to identify at least one potentially defective circuit pattern. The data processing unit may also compare a plurality of circuit patterns to valid patterns to identify the at least one circuit pattern that is potentially defective by subtracting the data which is representative of the lossy compressed images and the data which is representative of images of valid circuit patterns. The data processing unit may determine if the difference between the data which is representative of the lossy compressed images and the data which is representative of images of valid circuit patterns exceeds a predetermined threshold.

In one embodiment, the data processing unit determines a defective circuit pattern in the potentially defective pattern set using a knowledge base having images or information which are representative of valid circuit patterns.

In another embodiment, the data processing unit determines a defective circuit pattern in the potentially defective pattern set by comparing the plurality of potentially defective circuits of the potential defect pattern set to a knowledge base having valid circuit pattern images or information which are representative of valid circuit patterns. In this regard, the knowledge base may be continuously, periodically and/or intermittently updated with images or information which are representative of valid circuit patterns.

The data processing unit may determine a defective circuit pattern in the potentially defective pattern set by comparing the plurality of potentially defective circuits of the potential defect pattern set to a knowledge base having invalid circuit pattern images or information which are representative of invalid circuit patterns. Here, the knowledge base may be continuously, periodically and/or intermittently updated with images or information which are representative of invalid circuit patterns.

Notably, the data processing unit may select the codebook from a plurality of codebooks. In one embodiment, the data processing unit selects the codebook from a plurality of codebooks on the basis of a type of circuit defect. The codebook may include an edge-shape code-space or an N×M image patch or region code-space.

Again, there are many inventions, and aspects of the inventions, described and illustrated herein. This Summary of the Invention is not exhaustive of the scope of the present invention. Moreover, this Summary is not intended to be limiting of the invention and should not be interpreted in that manner. While certain embodiments, features, attributes and advantages of the inventions have been described in this Summary, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION

There are many inventions, and aspects of the inventions, described and illustrated herein. In a first aspect, the present invention is a system and technique for inspecting integrated circuits, including, for example, patterns projected, provided or formed on a wafer using photomasks, or patterns on the photomask itself. The inspection system and technique of this aspect includes first identifying, determining and/or detecting areas and/or patterns that are potentially defective by removing, filtering and/or eliminating from a set of potential defects any and/or all typical, regular or normal patterns. The identification, determination and/or detection of potential defects may be performed relatively quickly by a rapidly executing algorithm. In this way, a first or "coarse" analysis is performed rapidly and some, many, all or substantially all of the regular, normal or typical patterns are eliminated from further analysis.

Thereafter, a second more detailed analysis is performed. This second analysis focuses on the set of potential defects that were identified, determined and/or detected during the first analysis of the wafer (i.e., the "coarse" analysis). The second analysis may be considerably a more detailed or a "fine" analysis relative to the first or "coarse" analysis. Indeed, in one embodiment, the second analysis may implement a more computational intensive process, without sacrificing throughput, since only a small portion of the wafer is inspected in the second analysis. In this way, the detailed analysis of the defect candidates may identify (i) all or substantially all of the actual defects and/or (ii) only the actual defects from the potential defects identified during the first analysis.

The system and technique of the present invention reduces the computational requirements of inspecting integrated circuits since regular, normal and/or typical integrated circuit patterns are eliminated from further analysis and only atypical and/or irregular patterns are addressed via further or additional analysis. As such, the amount of data analyzed during the second or more detailed analysis is minimized and/or reduced, thereby improving the overall speed of the inspection process.

Notably, as described in more detail below, determination of typical and/or atypical patterns may be founded on a (predetermined, expandable, programmable and/or re-programmable) "knowledge" database including "good patterns" and/or "defect characteristics". The technique of the present invention advantageously employs an inherent self-learning capability in that the system learns and enhances its knowledge base through usage/operation and experience.

Figure 2:
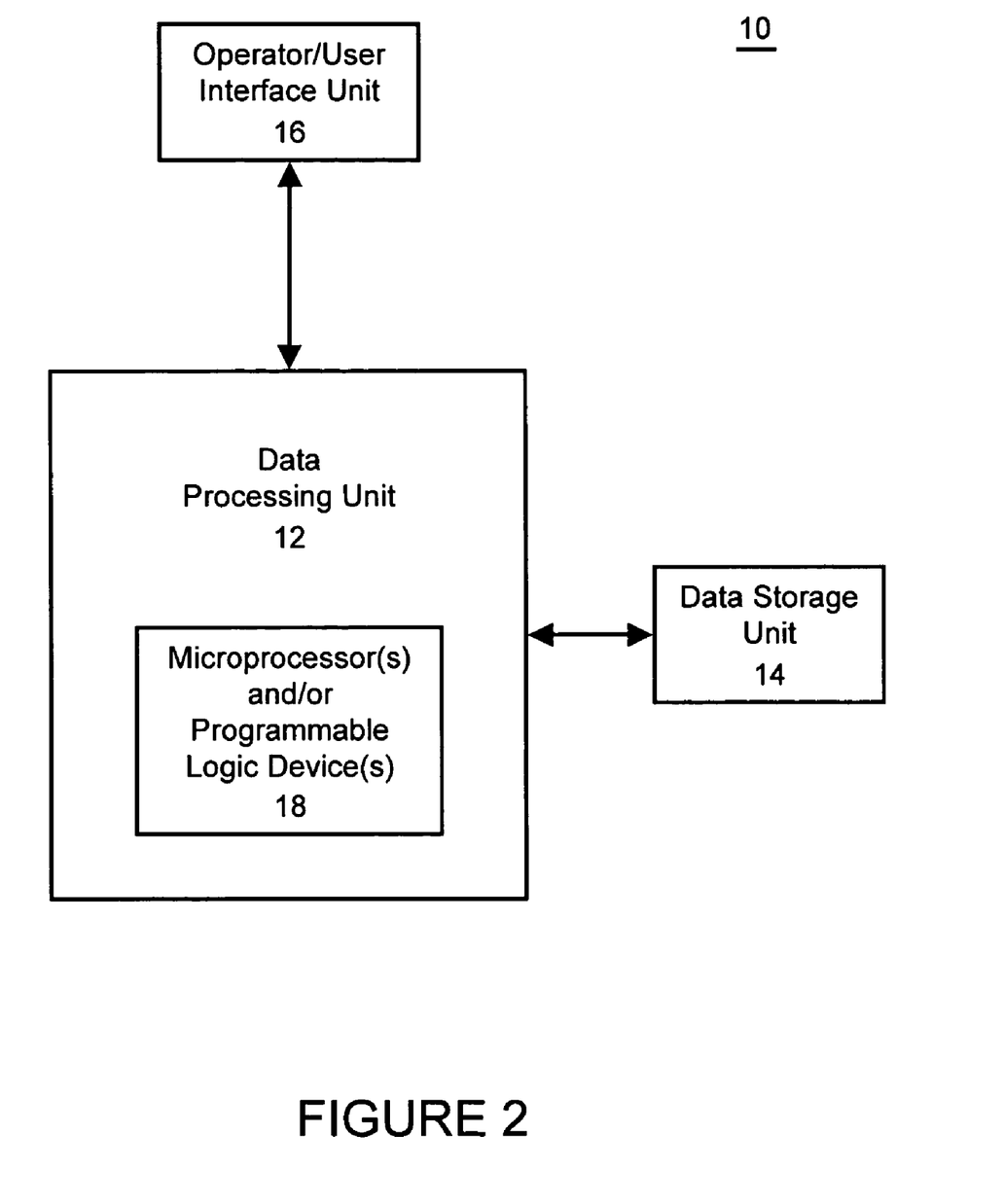
FIG. 2 is a block diagram representation of a system, in accordance with one embodiment of the present invention, that is capable of or suitable for implementing the techniques of the present invention.

With reference to FIG. 2, in one embodiment of the present invention, the inspection system 10 includes data processing unit 12, data storage unit 14 and operator/user interface 16. The data processing unit 12 executes the algorithms and software that process the data during implementation of the inspection techniques. In addition, data processing unit 12 manages data storage unit 14 and interfaces with operators or users via operator/user interface unit 16, for example, executes requests, commands and/or instructions from operators and users provided to data processing unit 12 via operator/user interface unit 16.

Briefly, data processing unit 12 may include one or more processors and/or programmable logic devices 18 to perform or execute instructions, arranged in, for example, routines or programs, which implement the inspection technique of the present invention. The processors and/or programmable logic devices 18 may be arranged in a parallel, serial and/or pipelined architecture. The processors and/or programmable logic devices 18 may execute or perform instructions in a parallel, serial and/or pipelined manner. In a preferred embodiment, a high-performance general-purpose computer cluster may be employed as data processing unit 12 in order to address the potentially extensive computational requirements in processing all the image data of the integrated circuit mask or wafer. Notably, any microprocessor(s), programmable logic device(s) and/or architecture, configuration, layout or arrangement thereof, whether now known or later developed, is intended to fall within the scope of the present invention.

In operation, data processing unit 12 performs or executes routines, programs, objects, components and/or data structures that implement particular tasks or operations of the inspection techniques of the present invention. The functionality of the routines or modules may be combined or distributed. Further, the routines or programs may be of any language including, for example, assembly, FORTRAN, C, C++, and BASIC, whether compiled or uncompiled code. In a preferred embodiment, C or C++ is employed because of its computation efficiency and relative ease in programming. However, data processing unit 12 may implement any programming language, whether now known or later developed; and, as such, all program language implementations of the inspection techniques of the present invention are intended to fall within the scope of the present invention.

With continued reference to FIG. 2, data storage unit 14 is connected to data processing unit 12 to provide data processing unit 12 with sufficient or suitable electronic storage or readable media. The data storage unit 14 may be a SCSI RAID hard-disk array, including a high capacity storage device, to store results and images of many inspection processes. The data storage unit 14 also stores the algorithms, routines and/or instructions to permit data processing unit 12 to implement or execute inspection techniques of the present invention.

The electronic storage or readable media may be volatile and nonvolatile, removable and non-removable media implemented in any method or technology for storage of information such as computer readable instructions (for example, instructions to implement the inspection techniques of the present invention), data structures, program modules or other data. For example, RAM, ROM, EEPROM, flash memory or other memory technology, BC-ROM, digital versatile disks (DVD) or other optical storage, magnetic cassettes, magnetic tape, magnetic disk storage or other magnetic storage devices, or any other medium may be used to store data which is, for example, used or processed by data processing unit 12 and/or which results from process data in accordance with the inspection techniques of the present invention. Any electronic storage or readable media and/or architecture, configuration, layout or arrangement thereof, whether now known or later developed, is intended to fall within the scope of the present invention.

The operator/user interface unit 16 may include input device(s), output device(s) and/or processor devices to permit an operator or user access to and/or control of inspection system 10. In one embodiment, operator/user interface unit 16 includes input device(s), such as a keyboard or mouse, and output device(s), such as visual display device (printer, CRT, LCD or other visual-type display). Thus, the user or operator (or other computing or external device) may interface and/or interact with inspection system 10 to (i) monitor, control and/or interact with inspection system 10 (for example the data processing unit 12) and/or (ii) review/analyze the inspection results generated by inspection system 10.

Notably, operator/user interface unit 16 may also include a suitably programmed computer to schedule, handle and/or perform requests and direct interaction between inspection system 10 and the operator or user. The suitably programmed computer may also perform additional analyses, such as yield enhancement.

As mentioned above, inspection system 10 implements an inspection technique including a first or "coarse" analysis to eliminate (from further analysis) some, many, all or substantially all of the regular, normal or typical patterns and/or identify (for further analysis) some, many, all or substantially all of the irregular, abnormal or atypical patterns. Thereafter, a second more detailed analysis is performed on the potential defects that were identified, determined and/or detected during the first analysis of the wafer (i.e., the "coarse" analysis). The second analysis may be considerably a more detailed or a "fine" analysis relative to the first or "coarse" analysis. In the second analysis, the defect candidates (determined by the first or "coarse" analysis) are analyzed to identify (i) all or substantially all of the actual or true defects and/or (ii) only actual or true defects.

In particular, the first analysis of the captured optical image identifies potential defects or defect candidates by identifying and/or distinguishing between typical and/or atypical circuit patterns. The first analysis may employ a plurality of different techniques to identify typical and/or atypical patterns. These techniques use pixel based information of the captured optical image to identify typical and/or atypical circuit patterns may be generally described and expressed as follows:

Consider two different transformations $T_1$ and $T_2$, to be operated on or applied to the captured image P, $T_1$ and $T_2$ may be characterized as:

$T_1(P)=T_2(P)$, for regular, common, typical and/or normal patterns; and $T_1(P) \neq T_2(P)$, for visible defects or a super-set of the visible defects.

where:

"=" means value is within a threshold or is within a range of values. In one embodiment, this analysis may be performed after FIR filtering; and "$\neq$" means value is exceeds a threshold or is outside a range of values.

Again, in one embodiment, this analysis may be performed after FIR filtering.

Thus, the defect candidates may then be identified when $T_1(P) \neq T_2(P)$.

Notably, it may be advantageous to employ a plurality of algorithm modules rather than one algorithm pair of $T_1$ and $T_2$ to capture, detect and/or identify all or substantially all defect candidates. In one embodiment, the first or "coarse" analysis of data may utilize a plurality of routines or algorithm modules to analyze the image wherein each routine or module may correspond to a pair of $T_1$ and $T_2$ that is directed to a predetermined, given, particular and/or unique type or form of defect candidate(s). In this way, more actual defects may be detected (rapidly) because more (and more diverse) defect candidates are identifiable or detectable by the plurality of different routines or algorithm modules embodying the first analysis.

In another embodiment, the first or coarse analysis may identify defect candidates using techniques that "mimic" a human's ability to identify typical and atypical patterns. In this embodiment, the inspection technique may employ image compression known as "lossy image compression", for example, JPEG, JPEG2000, and Vector-Quantization (VQ). Notably, there is a vast literature in image processing addressing image compression, of which a sub-category is "lossy image compression".

In short, lossy image compression attempts to capture, identify and/or detect what is most important in a picture, and ignores small irregularities. Using lossy image compression techniques, regular, common, typical and/or normal patterns may be identified from a captured or acquired aerial image (simulated or actual). The difference between the original (pixel based) image and the lossy compressed (pixel based) image may then represent the defect candidates. The relationship may be expressed as following:

$$D=P-\text{remap}\{\text{decompress}[\text{compress}(P)]\} \qquad \text{EQUATION 1}$$

where:
D is the difference image used to generate defect candidates
P is the captured image
"compress" represents a lossy compression algorithm It should be noted that the lossy compression algorithm expressed in EQUATION 1 may be tailored to general well-known circuit patterns or characteristics or to a particular, given and/or unique circuit patterns or characteristics.

It should be further noted that many lossy compression algorithms often change the edge profile in an image. As such, in one embodiment, the "remap" may be used to transform gray levels, pixel-by-pixel, to match back or conform to the original edge profile. In this way, there may be a reduction in the difference on normal edges.

From the difference image "D", the defect candidates may be generated through a thresholding technique, for example, a pixel only becomes defect candidate if the "absolute (D)" is larger than a certain threshold. The threshold may be determined using a number of different ways/techniques, for example, the threshold may be based on analysis of good patterns. In this regard, for some known good patterns (which can also be called as calibration patterns), find out the threshold level so that most regular, common, typical and/or normal patterns have an "absolute (D)" below the threshold. In general, the lower the threshold, the more locations will be flagged as defect candidates for future analysis (in the "fine" or second processes). The higher the threshold, the less number of candidates will be generated and hence the higher risk in losing a real defect. The threshold level is an algorithm parameter that can be set by user.

In one embodiment, the thresholding technique may be applied to a local summation in image D. For example, an n×n (such as a 2×2 or 3×3) neighborhood of pixels' "absolute (D)" may be summed up, and the summation is then compared to the threshold to determine whether it is a defect candidate. The summation may be further generalized to a weighted summation, for example, using a higher weight at the center pixel in a summation (such as, a 3×3), for example, having the center value weighted as 2 while all others as 1. Notably, the weight matrix may be thought as an FIR filter. The optimal weight matrix roughly matches with the shape of a real defect's signal in image D.

The threshold determines the sensitivity in generating defect candidates. The higher the threshold, the fewer candidates will be flagged, but the more likely a true defect will be lost in this candidate generation step.

In another embodiment, the "decompress-compress" pair may incorporate a low-pass filtering effect. As such, the "decompress-compress" pair may be substituted with a low-pass filter (for example, a Gaussian-type low-pass filter). In this embodiment, the technique expressed in EQUATION 1 may be re-characterized and expressed as follows:

$$D=P-\text{remap}[\text{filter}(P)] \qquad \text{EQUATION 2}$$

where:
D is the difference image used to generate defect candidates;
P is the captured image; and
"filter" represents a low-pass filtering operation.

The "remap-filter" pair expressed in EQUATION 2 effectively changes the gray levels of irregular shapes or patterns of the image while keeping the pixel values unchanged in black and white areas and straight edges. Notably, the gray levels of corners may change; as such, corners may become defect candidates under EQUATION 2. This notwithstanding, implementing the approach expressed in EQUATION 2 may result in a considerable reduction in computation and temporal overhead given that the plane area and/or the straight edges are eliminated as defect candidates and, as such, from detailed analysis of the second or "fine" analysis.

Figure 3:
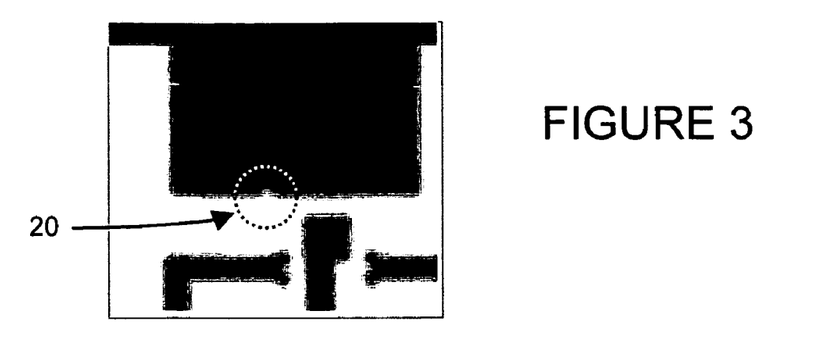
FIG. 3 illustrates an acquired or captured aerial image of a portion of an integrated circuit design, having an edge defect (within the dashed circle) that is close to the center of a large plane region.
Figure 4:
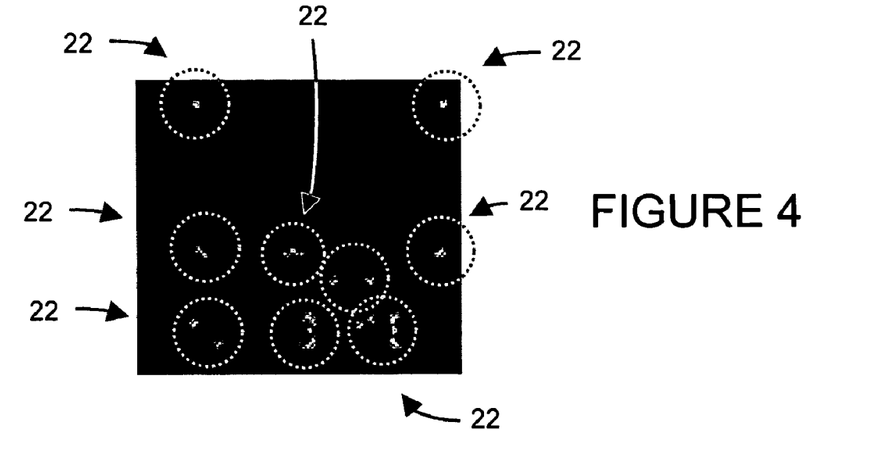
FIG. 4 illustrates the absolute value of the difference between the image of FIG. 3 and a modified image of FIG. 3 determined or calculated using a remap-filter pair operation that employs a Gaussian filter whose output was remapped to the straight edge profile; the edge defect is again highlighted via the dashed circle.
Figure 5:
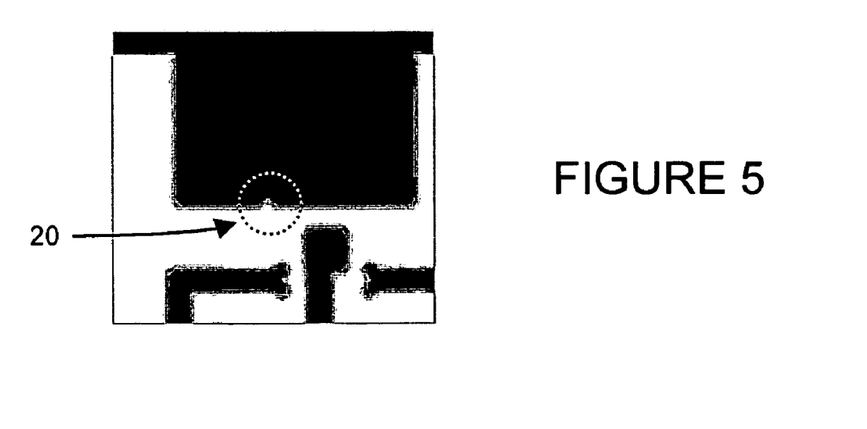
FIG. 5 is a representation of the image wherein the image of FIG. 4 overlays the image of FIG. 3.

FIGS. 3-5 highlight the impact of "remap-filter" pair embodiment, as expressed in Equation 2. Briefly, FIG. 3 is a captured image, with an edge defect close to the center of a large plane region (see area within dotted circle labeled 20). FIG. 4 is the absolute value of image D determined or calculated using the "remap-filter" pair of EQUATION 2, where a Gaussian filter was employed and then remapped back straight edge's profile. Notably, the defect is highlighted, together with corners of the features or patterns (labeled 22). Finally, FIG. 5 is generated or produced by overlapping FIG. 4 on top of FIG. 3—which illustrates where D has non-zero values.

Notably, the techniques using compression and/or filtering to identify or detect defect candidates (as characterized by EQUATIONS 1 and 2) are particular approaches that are more generally characterized by the transformations $T_1$ and $T_2$, to be operated on or applied to the captured image P, as described above.

As mentioned above, the inspection techniques of the present invention includes a second, more detailed analysis. The second or "fine" analysis is performed on the potential defects or defect candidates that were identified, determined and/or detected during the first or "coarse" analysis. This second analysis may be considerably more detailed in relation to the first analysis. In this regard, after identifying the one or more defect candidates, in one embodiment, the local image "patches" or regions, for example a 2×2, 4×4, 8×8 or 16×16 pixel region that encompasses the defect candidate is analyzed in detail to determine whether a defect is contained therein.

The second analysis may employ neighborhood information (i.e., local image "patches" or regions) to analyze a suspected defect, by comparing the image to a knowledge base built-up, compiled and/or developed through simulations, detection processes or "experience". The knowledge base contains, for example, images or information which is representative of good or acceptable patterns (for example, general characteristics of valid, acceptable and/or good patterns) and/or images or information which is representative of known defective, invalid or unacceptable patterns (for example, general characteristics of defective patterns).

Moreover, in one embodiment, inspection system 10 may also predict whether a "new" or unclassified pattern is a valid or defective pattern. From a machine-learning perspective, this presents an example of the (binary) classification problem: the algorithm is required to predict, for a new sample, the classification result (valid or defect pattern), based on a set of training data, instruction and/or equations.

An image of an N pixel×M pixel (for example, 16 pixels× 16 pixels, where N may or may not equal M), assuming the value of each pixel forms one dimension, may be represented by one point (or one vector) in the N×M-dimensional space (for example, 16×16=256 dimensional space). The n-dimensional space (in this example, n=256) is known as the "code-space" (i.e., the patterns that are "extracted", examined and/or evaluated upon which the second or "fine" analysis is performed and/or conducted).

Figure 6:
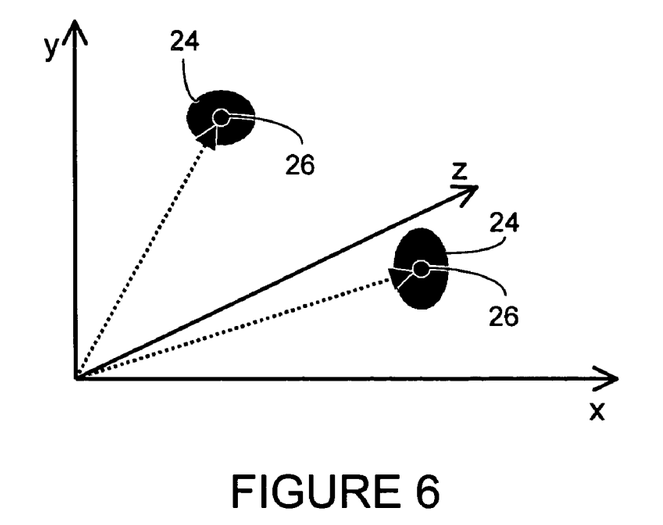
FIG. 6 illustrates an abstract 3-dimensional code-space spanned by three parameters (e.g., three pixels' values) X, Y, and Z, demonstrating that good, acceptable and/or valid patterns (i.e., valid circuit patterns) represent only a small portion of the code-space.

For example, with reference to FIG. 6 (an abstract 3-dimensional code-space is spanned by three parameters (for example, three pixels' values) X, Y, and Z), the good, acceptable and/or valid patterns (i.e., valid circuit patterns) represent only a small portion of the code-space (see, good pattern cluster 24). The knowledge base can therefore be represented by a codebook representing all the good patterns in this code-space. In other words, good or valid patterns form clusters in the code-space, and the codebook represents all the centers of the individual clusters.

For those clusters that have elongated shapes, a single cluster may be broken-up, divided or segmented into multiple adjacent clusters each having its own center. The locations of the individual cluster centers in the code-space are the "code-vectors" (See, 26 in FIG. 6), and the collection of code-vectors forms the codebook.

Figure 7:
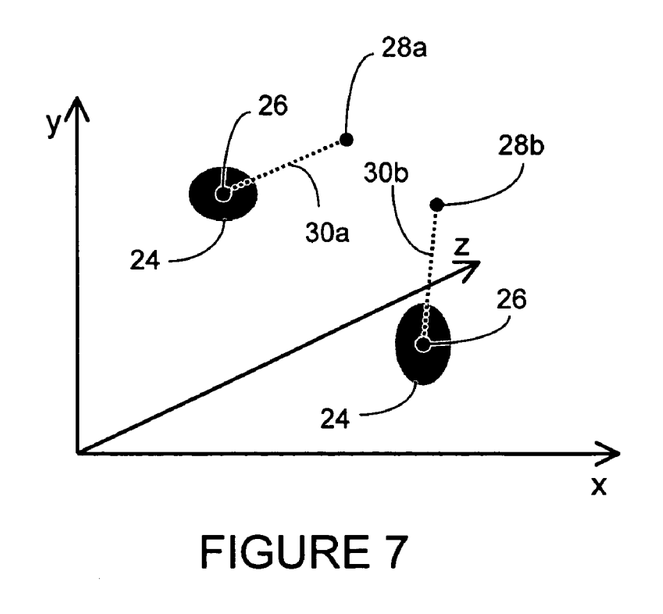
FIG. 7 illustrates, for a given codebook and an identified defect candidate, a Euclidian distance that is computed or determined between the candidate's local image patch (which is a vector in the code-space) and its nearest code-vector.

With reference to FIG. 7, in one embodiment, (after construction of the codebook) for each defect candidate, a Euclidian distance may be computed or determined between a candidate's local image patch (for example, image patch 28a or 28b) and its nearest code-vector. The Euclidian distance is a vector in the code-space. The Euclidian distance may be characterized as the sum of the square difference between two vectors (for this case, one vector is the code-vector, and the other is the defect candidate image patch), and the nearest code-vector is the code-vector that has the minimum Euclidian distance from the image patch. This minimum Euclidian distance may be known as the "defect-signal" 30a and 30b. Notably, defect signal 30a corresponds to or is associated with image patch 28a, and defect signal 30b corresponds to or is associated with image patch 28b.

In one embodiment, inspection system 10 determines whether a potential defect pattern is an actual defect pattern, by applying a threshold to the defect signal. The threshold value determines the defect detection sensitivity. That is, the lower the threshold, the more defects will be identified or detected, thereby potentially designating or registering more false or erroneous defects. Conversely, the higher the threshold, the fewer defects will be identified or detected, and as such, there is a potential that more defects will be considered acceptable or good patterns.

In one embodiment, the selection of the threshold may depend on the amount of training or experience, the breadth or extent of the codebook and/or the image noise level. For example, as the codebook expands or becomes more complete (for example, by way of training or simulation), a smaller threshold may be used without unduly increasing the possibility of generating false defects during the second or fine analysis. Further, as the noise in the image increases, inspection system 10 may create larger deviations in good or acceptable patterns from its code-vector (i.e., its cluster center), and hence a higher threshold may be used to avoid identifying, registering or determining those good patterns as defect patterns.

In one example, the threshold for the defect signal may be calibrated from know good patterns. The threshold should be set so that no false defects are reported. If there are known defects in the calibration patterns, the threshold may be set at the mid-point between the highest signal of non-defective patterns and lowest signal of defective patterns.

The threshold may be variable based on code-vectors (i.e., a particular threshold for one or more code-vectors). For example, for code-vectors that represent larger clusters, the threshold may be larger. Where code-vectors represent pattern that do not need high sensitivity, the threshold may also be larger. The converse is also possible (for example, for code-vectors that respect smaller clusters, the threshold may be smaller).

It should be noted that the threshold may also be variable of the orientation of the Euclidian distance in the hyper-dimensional code-space, to represent non-round shaped clusters in the hyper-dimensional space.

The codebook is built-up, created and/or developed by analyzing the frequency of occurrence (i.e., clustering) in images of known good patterns. These are known as "source-vectors". The source-vectors may be collected or compiled from images of large circuit designs. It should be noted that the codebook employed to identify, register and/or determine defects may be determined or vary based on manufacturing technologies and types of patterns. For example, the codebook may be different for patterns having OPC design, patterns with different OPC design technologies and/or patterns of different circuit layers (for example, a contact layer may have different codebook from a gate layer). Therefore, for different manufacturing technologies and/or different circuit layer, a different codebook may be used, developed, built-up and/or employed in the inspection process.

Certain considerations of the inspection technique implemented by inspection system 10 during the second "fine" analysis are the ability to efficiently develop or build-up the codebook using the source vectors and the ability to rapidly identify or match the nearest code-vector to an arbitrary image patch. Generally, the smaller the number of code-vectors in the codebook, the faster the process may be implemented, since the fewer code-vectors need to be considered. However, the smaller number of code vectors, the less knowledge is built-up and more good patterns may be incorrectly identified, registered, determined or designated as defects.

It may be advantageous to implement an inspection technique that requires maintaining, storing and/or processing less data than more data to analyze a potential defect. In this way, the amount of data "handled" by inspection system 10, via the inspection algorithm, for a given image patch or region is minimized, reduced and/or limited. For example, a 256-dimensional space may be too large to be efficiently and rapidly handled by a current general-purpose computer when building clusters or searching for nearest code-vector. One technique to minimize, reduce or limit the amount of data processed by inspection system 10 is to reduce the image patch or region size, for example, rather than addressing a 16×16 image region or patch (i.e., a 256-dimensional space), the system may address an 8×8 or 4×4 image region or patch.

Another technique to minimize, reduce and/or limit the amount of data maintained, stored and/or processed by inspection system 10 may be to reduce the number of values represented by each dimension, for example, from an 8-bit pixel value (0-255) to a 4-bit pixel value (0-15). In this way, inspection system 10 processes or analyzes considerably less data for one or more, or every defect candidate.

Indeed, in one embodiment, one, some or all of the aforementioned techniques to minimize, reduce or limit the amount of data processed by inspection system 10 may be employed on potential defects (image region or patch) regardless of the defect candidate or the type of suspected defect. In another embodiment, one, some or all of the aforementioned techniques to minimize, reduce or limit the amount of data processed by inspection system 10 are employed on a candidate by candidate basis and/or in accordance with the type of defect suspected. In this way, the system has the flexibility to more thoroughly analyze a defect candidate to determine whether or not the candidate region is an actual defect in the pattern.

In one embodiment, inspection system 10 and the inspection method implemented thereby, may reduce the computational overhead by performing the cluster build-up and search in multiple steps, passes or cycles in an iterative manner. For example, a first step, pass or cycle (that is, a "coarse" search) is a rapid search to reduce later search space of the second step, pass or cycle. Thereafter, the search may evaluate the entire code space of a given or particular region identified in the first step, pass or cycle. For example, in the first step a 16×16 image patch may be down-sampled to 8×8 by averaging every 2×2 pixels, thereby effectively combining every neighboring 4 dimensions into one dimension. The second search may then evaluate the entire or full code-space; that is, without downsizing. From the results of earlier process, the later process can search in a reduced sub-space of the full code-space, and for a reduced number of defect candidates and reduced number of code-vectors.

In yet another embodiment, inspection system 10 and method employs, in addition to or in lieu of the image patch or region base analysis, an edge pattern based analysis to detect, identify, register, confirm and/or determine actual defects. In this embodiment, inspection system 10 may implement an edge-shape analysis technique that includes or considers the orientation angle of the gradient. The edge-shape analysis may include other parameters on the edge, for example, the gradient magnitude.

An edge-shape analysis technique may reduce computational overhead by analyzing the information degeneration in an image patch or region. For example, instead of using all the pixel values to form the code-space, a pattern shape may be used to determine whether the defect candidate is an actual defect. Pattern shape may not depend on where it is located in the image patch, nor which orientation it has. In pattern shape analysis, edges tend to play a critical role.

By analyzing the edge of a pattern, rather than pixel values, there may be no need to build or create a codebook in the entire n-dimensional code-space (for example, n=256), but only in a transformed code-space with a much smaller number of dimensions. For example, for defect candidates that are located on edges, the shape of the edge, instead of the pixel values, may be used to form the code-space. The edge shape may be determined or represented by recording or measuring the orientation (i.e., the angle value) of the edge gradient along a segment of the edge, for example, a 16-pixel segment. The gradient orientation of the x-pixel segment (for example, x=16) may be used to form or develop an x-dimensional code-space which may be used to build, develop or compile a codebook.

In this regard, edges of good patterns form clusters in this edge pattern based code-space. This kind of pattern transformation reduces the dimension of the code-space, and hence reduces the complexity in both building the codebook and searching for nearest code-vector. For example, an edge mouse-bite will cause a bump-dip pair in the gradient orientation that will not exist for good patterns, making mouse-bite edge pattern far away from all code-vectors in the codebook.

In those embodiments where inspection system 10 employs a gradient orientation analysis, degenerating edge directions may further reduce the code-space dimension. For example, vertical and horizontal edges may be treated as the same in the code-space. This degeneration may be achieved by setting the average gradient orientation angles to zero (or some fixed number), hence reducing the dimensions by one.

Notably, other degenerating techniques, for example, degenerating the symmetry in the edge segment, may be used alone or in combination with the aforementioned degenerating techniques. All such techniques, whether now known or later developed, are intended to be within the scope of the present invention.

Calculating some characteristic parameters using the edge trace may further reduce the code-space dimension. For example, if two characteristic parameters are extracted for analysis, the code-space dimension is reduced to two. FIGS. 8-11 illustrate one example of using edge trace code-space to detect an edge defect, using a two-dimensional code space.

Figure 8:
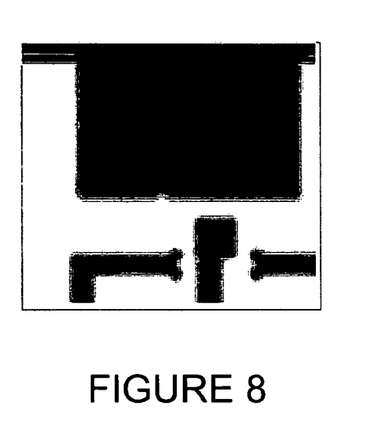
FIG. 8 illustrates the acquired or captured aerial image of FIG. 3, including the edge defect (within the dashed box) that is close to the center of a large plane region.
Figure 9:
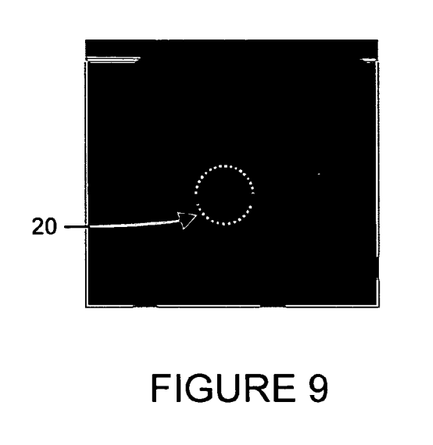
FIG. 9 illustrates the aerial image of FIG. 8 wherein the edges are highlighted after an edge tracing.

FIG. 9 highlights the edges after an edge tracing of FIG. 8. The defect is located within the dotted circle labeled 20.

Figure 10:
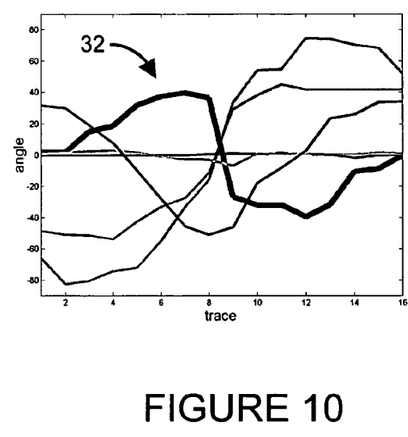
FIG. 10 illustrates six different "orientation angle vs. edge trace pixel number" for a sixteen-pixel edge segment; the six different traces are taken from various edge locations in FIG. 8; the angle-trace line around the defect is the thick line.

FIG. 10 illustrates six different "orientation angle vs. edge trace pixel number" for a sixteen-pixel edge segment. The six different traces are taken from various edge locations in FIG. 9. The angle-trace line around the defect is the thick line (labeled 32).

Figure 11:
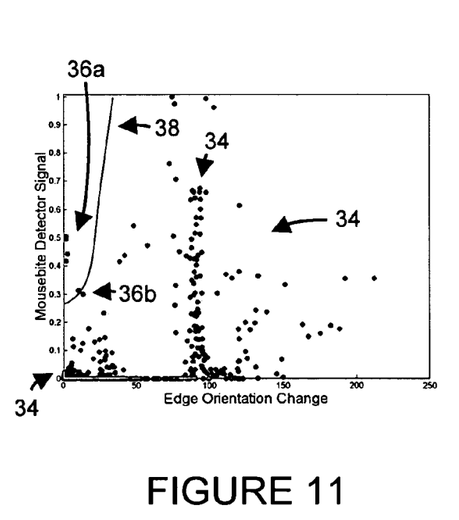
FIG. 11 illustrates the scatter plot of two characteristic parameters extracted from all 16-pixel edge segments.

FIG. 11 illustrates the scatter plot of two characteristic parameters extracted from all 16-pixel edge segments. The horizontal axis is the value of the parameter "Edge Orientation Change", which represents the orientation difference between the outer four pixels of the sixteen pixel segment. The vertical axis is the value of the parameter "Mousebite Detector Signal", which represents the difference between the peak (in the bump) and the valley (in the dip) in the central eight pixels of the sixteen pixel segment. All edge segments of good patterns are shown as dots generally labeled as 34, and the segments around the defect are shown in dots labeled as 36a and 36b. As can be observed, the dots labeled 36a and 36b are separated from the dots labeled 34. For two-dimensional code-space, in lieu of (or in addition to) using codebook and Euclidian distance, a partitioning of the code-space can separate the region that represents good pattern from the region that represents defective pattern.

It should be noted that, in one embodiment, the curve (labeled 38) illustrated in FIG. 11 may be used to partition the code-space into two regions. Three of the dots (labeled 36a) lie deep inside the defective region, while two of the dots (labeled 36b) lie around a boundary (designated by curve labeled 38). It should be further noted that there may be no need to have all five dots (labeled 36a and 36b) inside the defective region. The defect is captured as long as one (or more) of the dots lie or are disposed inside the defective region.

The partitioning curve 38 may be determined or pre-determined, for example, in two ways: (1) using calibration data, i.e., calibrate the curve so that it does not give false defects but captures all real defects; or (2) based on simulation and defect sensitivity requirement. In designing the two characteristic parameters that represented the two axis in FIG. 11, it is expected that mouse-bite defect should locate in the area with high mouse-bite signal (i.e., large difference between peak and valley in the bump-dip pair) and low orientation changes (since mouse-bite locates on a straight line and hence no orientation change in edge gradient before and after the mouse-bite). Simulation can pre-determine the curve 38 assuming certain noise level in the image and with programmed artificial defects, so that curve 38 separates the region of defect and non-defect.

Notably, in addition to, or in lieu of edge-shape analysis, other pattern shape characteristic parameters may be used in forming the code-space, for example, the pattern size. For example, a legitimate pattern generally has a size or dimension larger than certain minimal value. If a patterns' size or dimension is smaller than that minimal value, it may well be a defect, and the threshold is then set at that minimal size or dimension.

In another embodiment, inspection system 10 and method employs characteristic parameters computed from the pixel values to realize information degeneration in an image patch or region. In this embodiment, the code-space is transformed from the pixel-value space to the characteristic-parameter space, which may have a reduced number of dimensions. For example, for a 3×3 image patch, instead of using the nine dimensional code-space formed by pixel values, only three local characteristic parameters (for example, "local average", "local slope", and "derivative of the local slope") may be computed to provide a three dimensional code-space. These parameters may (or may not) completely ignore the pattern orientation and placement. For normal good circuit patterns, the three parameters may be correlated through the distance to a nearby edge, and hence clustered. A defect, for example, a particle or contamination, may result in an image patch that is far away from all code-vectors in the codebook, and hence renders itself detectable.

Indeed, while different codebooks may be used in handling different good pattern and/or defect pattern characteristics (as mentioned above), different code-space may also be used for different types of defects. In this embodiment, a code-space selection is made (based on, for example, the type of defect) thereby designating the use of a particular codebook. For example, the edge-shape code-space may be employed for capturing or analyzing potential edge defects, and the characteristic-parameter code-space of an N×M image patch or region (for example, 3×3) may be used to capture contamination and particles. The combination of the code-space and codebook selections may accommodate many different types of defects in various pattern designs.

In another embodiment, the results of or outcome from the variety of defect detectors (i.e., alternative code-spaces and/or alternative codebooks) may then be combined. The method of combination can be logical "OR" (i.e., defective if detected by any one detector), logical "AND" (defective only if detected by all detectors or a subset of detectors), or "VOTE" (defective if detected by a certain number of detectors). Indeed, other combinations and permutations of such embodiments may be implemented by the system and method of the present invention and, as such, all combinations and permutations are intended to be within the scope of the inventions.

In another embodiment, inspection system 10 may employ an inspection technique that implements a one-dimensional code-space for certain special or unique types of defects (for example, gate linewidth defects, contact area defects and/or corner or serif rounding defects). In this regard, valid, good and/or acceptable gate patterns typically have very similar gate linewidth. Thus, by identifying the gates and measuring their linewidth, the self-inspection algorithm may capture, identify, register and/or detect those gates that have linewidth as outliers in the linewidth distribution.

The inspection system and method of the present invention may implement machine learning techniques, namely "Support Vector Machines (SVM)" and other kernel-based algorithms, to further reduce the number of dimensions of code-space. These types of algorithms are introduced in the book "An introduction to Support Vector Machines and other kernel-based learning methods", Nello Cristianini, John Shawe-Taylor, ISBN 0-521-78019-5 (incorporated herein by reference). In this regard, a relatively low-dimensional input space may be mapped to a higher-dimensional feature space, via a nonlinear transform. Conceptually, the Euclidean distance is calculated and a linear classifier is built, in the higher-dimensional feature space, which provides more degrees of freedom and flexibility than the original input space. Employing the "kernel-trick", which enables the distance to be calculated as "kernels" in the original input space, reduces the amount of computation. Also, support vector machines are capable of defining the boundary between two classes (good pattern vs. defect) using a small number of extracted "support vectors", hence speeding up the computation for real-time classification.

The inspection system and method described above possess the inherent capability to be continuously, periodically or intermittently "trained" while in operation. This training is the process of continuously, periodically or intermittently building-up, enhancing, developing and/or creating new or additional knowledge using good and defect patterns to update and/or enhance the codebook. For example, if during operation, the system identifies, registers or determines a good pattern as being a defect, and the operator informs or instructs the system that it is a false or erroneous defect identification, the knowledge base (i.e., the codebook) may be updated, changed and/or modified to include this pattern as a good pattern by adding a new code-vector in the codebook. This mode of operation is known as "supervised learning".

Notably, the system and method of the present invention may "learn" without operator input. That is, during operation, the system may continuously, periodically or intermittently analyze the clustering property in the code-space. In the event that a new cluster forms outside existing codebook, system 10 may indicate a new type of valid or good pattern (and/or invalid or defect pattern) that have not been previously analyzed or detected. The codebook may thereafter be updated to include this new type of good pattern. That is, this algorithm has inherent, non-supervised, self-learning capabilities.

The codebook may be built-up, created, modified, developed or changed dynamically using images of a local area, without prior knowledge base. This method may automatically realize an inspection concept called "cell-to-cell (C:C)". Indeed, it may achieve better results than the conventional C:C inspection.

Briefly, conventional C:C inspection techniques use comparisons between cells in a pattern array, for example, a memory array area of an integrated circuit. C:C is generally performed by comparing the image with a shifted version of the same image, where the shift is equal to the array period. The net effect is that a cell is compared to its neighboring cell. It is a special case of D:D inspection methodology, but the reference image is from the same die instead of a different die.

The codebook that is built-up dynamically from local image may automatically cluster information of the same pattern from all cells. Using this codebook, the system and method automatically realize the comparison between a defect candidate image and all similar patterns. This self-inspection method is known as "Dynamic Self-Inspection or DSI". DSI can achieve better results than conventional C:C inspection in at least three aspects:

The codebook contains information from all cells, not just the neighboring cell. So, DSI achieves comparison to the average information of all cells, which has less noise than just one copy of a neighboring cell. Therefore, DSI can achieve higher sensitivity than conventional C:C inspection.

The clustering method in DSI eliminates the requirement that the cells reside in a periodic array. As long as there are multiple cells in a local image, even if they are not positioned periodically, DSI can assemble the information automatically from all the cells. Hence DSI has wider applicability that conventional C:C inspection.

DSI relaxes the requirement of the cell structure. For example, a rectangular has four corners and each has its serif. The four serifs have different orientations, but the fundamental shapes are the same. DSI can automatically cluster these same shapes regardless of their orientation, and therefore achieve comparison of a defect candidate to similar shapes, even if the conventional cell structure does not exist.

Furthermore, the system may employ DSI in combination with the knowledge base built up from prior knowledge. In this regard, when the system cannot match a defect candidate image to a code-vector in the dynamically built codebook, the system may then compare that defect candidate image to a codebook built up from prior knowledge. For example, in the boundary area of an array region, some patterns are not in the cell and hence may not have matching code-vector in the dynamic codebook. The system may then compare those patterns to a prior-knowledge codebook to determine whether those patterns are defects.

As indicated above, the system and method may also maintain defect information as part of the knowledge base. All confirmed defect image patches may be collected and form a subset of the codebook or a codebook of defects. Frequent defect types may form clusters, but most defects will likely be scattered around in the code-space. For a new defect candidate, if its image patch is within certain threshold distance from a defect code-vector, it is likely to be a defect, and hence be detected.

This defect codebook can also be trained during the algorithm usage by adding new defect code-vectors. However, it should be realized that, a codebook of good patterns may be easier to build and maintain, since good patterns will be clustered in code-space, while defects may be arbitrary and hence scattered.

Thus, in this embodiment, in those instances where a new pattern is detected, that pattern may be analyzed relative to a codebook containing information pertaining to good and defect patterns. In this way, a "decision", with a high degree of confidence, may be made.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present invention.

It should be noted that the size of the local image "patches" or regions may be fixed regardless of the defect candidate or the type of suspected defect. In another embodiment, the size of the local image "patches" or regions may vary on a candidate basis and/or in accordance with the type of defect suspected. In this way, the system has the flexibility to more thoroughly analyze a defect candidate to determine whether or not the candidate region is an actual defect.

The embodiments directed to reducing computational overhead may be implemented singly or in combination. Indeed, all combinations and permutations of such embodiments may be implemented by the system and method of the present invention and, as such, are intended to be within the scope of the inventions.

An image of the circuit pattern(s) may be obtained using any technique now known or later developed. For example, the aerial image of the circuit pattern(s) may be generated or obtained using data sampled, captured or obtained in situ and/or using simulation data.

Where the aerial image of the circuit pattern(s) is generated or obtained using data sampled, captured or obtained in situ, in one embodiment of the inspection system and technique according to the present inventions, the systems, devices and/or techniques described and illustrated in non-provisional patent application "System and Method for Lithography Process Monitoring and Control", which was filed on Mar. 18, 2003 and assigned Ser. No. 10/390,806 (hereinafter "Lithography Process Monitoring and Control Patent Application"), may be employed to measure, inspect, characterize and/or evaluate optical lithographic equipment, methods, and/or sub-systems related thereto (for example, the optical sub-systems and control systems of the equipment as well as photomasks used therewith). In this regard, the aerial image(s) sampled and/or collected using the systems and techniques of the Lithography Process Monitoring and Control Patent Application may be provided to the system of the present invention for inspection. In this way, the system of the present invention inspects the aerial image of the photomask using the post-RET database and the optical settings of the lithographic equipment (notably, the resist development and substrate etch simulations are omitted if only aerial image is needed), and the systems and techniques of the Lithography Process Monitoring and Control Patent Application provide the actual aerial image (on a pixel-by-pixel basis) captured from inside the lithographic equipment. It is expressly noted, however, that the entire contents of the Lithography Process Monitoring and Control Patent Application including, for example, the features, attributes, alternatives, materials, techniques and advantages of all of the inventions, are incorporated by reference herein.

Where the aerial image of the circuit pattern(s) is generated or obtained using data sampled, captured or obtained using simulation data, in one embodiment of the inspection system and technique according to the present inventions, the systems, devices and/or techniques described and illustrated in non-provisional patent application "System and Method for Lithography Simulation", which was filed on Apr. 1, 2004 and assigned Ser. No. 10/815,573 (hereinafter "Lithography Simulation Patent Application"), may be employed to simulate, verify, inspect, characterize, determine and/or evaluate the lithographic designs, techniques and/or systems, and/or individual functions performed thereby or components used therein. It is expressly noted, however, that the entire contents of the Lithography Simulation Patent Application, including, for example, the features, attributes, alternatives, materials, techniques and advantages of all of the inventions, are incorporated by reference herein.

The system of the present invention includes one or more computers or other data processing devices to perform or execute computer-executable instructions, such as program modules. Generally, program modules include routines, programs, objects, components and/or data structures that perform particular tasks or implement particular abstract data types. Typically the functionality of the program modules may be combined or distributed.

Additionally, the embodiments described herein may be implemented (in part) as logical operations performed by programmable processing devices. The logical operations of these various embodiments of the present invention are implemented (1) as a sequence of computer implemented instructions, routines or program modules running on a data processing system and/or (2) as interconnected machine modules or hardware logic within a computing system. Accordingly, the logical operations making up the embodiments of the invention described herein can be variously referred to as operations, instructions, routines or modules.

The above embodiments of the present invention are merely exemplary embodiments. It is to be understood that other embodiments may be utilized, and changes may be made, without departing from the spirit or scope of the present invention as recited in the attached claims. As such, the foregoing description of the exemplary embodiments of the invention has been presented for the purposes of illustration and description. They are not intended to be exhaustive of, or to limit the invention to the precise forms disclosed. Many modifications and variations are possible in light of the above teaching. As such, the foregoing description of the exemplary embodiments of the invention has been presented for the purposes of illustration and description. It is intended that the scope of the invention be limited not to this detailed description, but rather by the claims appended hereto.

What is claimed is:

1. A method for inspecting a photomask used to generate integrated circuit patterns on a wafer, the method comprising:
   a computer performing steps comprising:
      generating a potentially defective circuit pattern set, having a plurality of potentially defective circuit patterns including a first circuit pattern that is defective and a second circuit pattern that is valid, wherein generating the potentially defective circuit pattern set includes:
         applying an algorithm to data representative of images of a plurality of circuit patterns to generate data representative of images of valid circuit patterns and
         comparing the data representative of images of a plurality of circuit patterns to the data representative of images of valid circuit patterns to identify at least one potentially defective circuit pattern; and
      determining a defective circuit pattern in the potentially defective circuit pattern set using a codebook including codes representative of known valid circuit patterns or codes representative of known invalid circuit patterns.

2. The method of claim 1 further including generating an image of at least a portion of the photomask including an image of the plurality of circuit patterns.

3. The method of claim 2 wherein generating an image of at least a portion of the photomask includes measuring intensity data, in situ, using an image sensor having a plurality of sensor cells.

4. The method of claim 2 wherein generating an image of at least a portion of the photomask includes simulating the image using information in a mask database.

5. The method of claim 4 wherein simulating the image using information in a mask database includes converting a plurality of polygons, including resolution enhancement technology, to a pixel-based bitmap representation thereof.

6. The method of claim 2 wherein the data representative of the images of a plurality of circuit patterns are pixel-based bitmap representations thereof.

7. The method of claim 6 wherein the algorithm includes a lossy compression algorithm and a decompression algorithm such that the data representative of images of valid circuit patterns is data representative of decompressed lossy compressed images.

8. The method of claim 7 wherein:
   comparing the data representative of images of a plurality of circuit patterns to the data representative of images of valid circuit patterns to identify the at least one potentially defective circuit pattern includes subtracting the data representative of the decompressed lossy compressed images from the data representative of images of the plurality of circuit patterns; and
   the method further includes determining if the difference between the data representative of the decompressed lossy compressed images and the data representative of images of the plurality of circuit patterns exceeds a predetermined threshold.

9. The method of claim 1 wherein determining a defective circuit pattern in the potentially defective circuit pattern set includes using a knowledge base having valid circuit pattern images or information representative of valid circuit patterns.

10. The method of claim 1 wherein determining a defective circuit pattern in the potentially defective circuit pattern set further includes comparing the plurality of potentially defective circuits of the potentially defective circuit pattern set to a knowledge base having valid circuit pattern images or information representative of valid circuit patterns.

11. The method of claim 10 further including continuously, periodically or intermittently updating the knowledge base with valid circuit pattern images or information representative of valid circuit patterns.

12. The method of claim 1 wherein determining a defective circuit pattern in the potentially defective circuit pattern set further includes comparing the plurality of potentially defective circuit patterns of the potentially defective circuit pattern set to a knowledge base having invalid circuit pattern images or information representative of invalid circuit patterns.

13. The method of claim 12 wherein the knowledge base is continuously, periodically or intermittently updated with invalid circuit pattern images or information representative of invalid circuit patterns.

14. The method of claim 1 further including selecting the codebook from a plurality of codebooks.

15. The method of claim 14 wherein selecting the codebook from a plurality of codebooks includes selecting the codebook on the basis of a type of circuit defect.

16. The method of claim 14 wherein the codebook includes an edge-shape code-space.

17. The method of claim 14 wherein the codebook includes an N×M image patch or region code-space.

18. An inspection system to inspect a photomask used to generate integrated circuit patterns on a wafer, the system comprising:
   a user interface unit;
   a data storage unit;
   a data processing unit, coupled to the user interface unit and the data storage unit, to identify a defective circuit pattern in an integrated circuit pattern, the data processing unit configured to:
      generate a potentially defective circuit pattern set, having a plurality of potentially defective circuit patterns including a first circuit pattern that is defective and a second circuit pattern that is valid, by applying an algorithm to data representative of images of a plurality of circuit patterns to generate data representative of images of valid circuit patterns and comparing the data representative of images of a plurality of circuit patterns to the data representative of images of valid circuit patterns to identify at least one potentially defective circuit pattern; and determine a defective circuit pattern in the potentially defective circuit pattern set using a codebook including codes representative of known valid circuit patterns or codes representative of known invalid circuit patterns.

19. The system of claim 18 wherein the algorithm includes a lossy compression algorithm and a decompression algorithm such that the data representative of images of valid circuit patterns is data representative of decompressed lossy compressed images.

20. The system of claim 19 wherein the data processing unit is configured to compares data representative of images of a plurality of circuit patterns to data representative of images of a plurality of valid patterns to identify the at least one circuit pattern that is potentially defective by subtracting the data representative of the decompressed lossy compressed images from the data representative of images of the plurality of circuit patterns.

21. The system of claim 20 wherein the data processing unit is configured to determine if the difference between the data representative of the decompressed lossy compressed images and the data representative of images of the plurality of circuit patterns exceeds a predetermined threshold.

22. The system of claim 18 wherein the data processing unit is configured to determine a defective circuit pattern in the potentially defective circuit pattern set using a knowledge base having valid circuit pattern images or information representative of valid circuit patterns.

23. The system of claim 18 wherein the data processing unit is configured to determine a defective circuit pattern in the potentially defective circuit pattern set by comparing the plurality of potentially defective circuit patterns of the potentially defective circuit pattern set to a knowledge base having valid circuit pattern images or information representative of valid circuit patterns.

24. The system of claim 23 wherein the data processing unit is configured to continuously, periodically or intermittently updates the knowledge base with valid circuit pattern images or information representative of valid circuit patterns.

25. The system of claim 18 wherein the data processing unit is configured to determine a defective circuit pattern in the potentially defective circuit pattern set by comparing the plurality of potentially defective circuit patterns of the potentially defective circuit pattern set to a knowledge base having invalid circuit pattern images or information representative of invalid circuit patterns.

26. The system of claim 25 wherein the data processing unit is configured to continuously, periodically or intermittently update the knowledge base with invalid circuit pattern images or information representative of invalid circuit patterns.

27. The system of claim 18 wherein the data processing unit is configured to select the codebook from a plurality of codebooks.

28. The system of claim 27 wherein the data processing unit is configured to select the codebook from a plurality of codebooks on the basis of a type of circuit defect.

29. The system of claim 27 wherein the codebook includes an edge-shape code-space.

30. The system of claim 27 wherein the codebook includes an N×M image patch or region code-space.

31. The system of claim 18 wherein the data processing unit is configured to generate an image of at least a portion of the photomask, including an image of the plurality of circuit patterns.

32. The system of claim 31 further including an image sensor, having a plurality of sensor cells, to measure intensity data representative of the image of the photomask and wherein the data processing unit is configured to generate an image of at least a portion of the photomask using the intensity data.

33. The system of claim 31 wherein the data processing unit is configured to generate an image of at least a portion of the photomask by simulating the image using information in a mask database.

34. The system of claim 33 wherein simulating the image using information in a mask database includes converting a plurality of polygons, including resolution enhancement technology, to a pixel-based bitmap representation thereof.

35. The system of claim 31 wherein the data representative of the images of a plurality of circuit patterns are pixel-based bitmap representations thereof.

* * * * *